United States Patent [19]

Ohashi

[11] Patent Number: 4,679,025
[45] Date of Patent: Jul. 7, 1987

[54] CONSTRUCTION FOR ELECTRICAL CONTROL PANEL

[75] Inventor: Yoshihiro Ohashi, Miyagi, Japan

[73] Assignee: Alps Electric Co., Ltd., Japan

[21] Appl. No.: 803,542

[22] Filed: Dec. 2, 1985

[30] Foreign Application Priority Data

Dec. 1, 1984 [JP] Japan .......................... 59-181554[U]
Dec. 1, 1984 [JP] Japan .......................... 59-181555[U]
Dec. 1, 1984 [JP] Japan .......................... 59-181556[U]

[51] Int. Cl.⁴ .......................................... H01C 10/00
[52] U.S. Cl. .................................... 338/197; 338/184; 361/400
[58] Field of Search ............... 338/197, 165, 176, 154, 338/184, 190, 194; 361/400, 401

[56] References Cited

U.S. PATENT DOCUMENTS 4,369,424  1/1983  Miyamoto ...................... 338/184 X
4,533,805  8/1985  Fujinami et al. ............... 338/184 X Primary Examiner—Harold Broome
Assistant Examiner—M. M. Lateef
Attorney, Agent, or Firm—Guy W. Shoup

[57] ABSTRACT

An electrical part, either of rotary type or linear slide type, including a circuit pattern, a sliding member sliding on the circuit pattern, and an operating member for operating the sliding member, in which the circuit pattern is provided on a circuit sheet made of an insulating film, the circuit sheet is sandwiched between a pair of support plates, means for slidably and engagedly holding the operating member is provided on either of the support plates, and the operating member is projected out of a through hole provided in the support plate.

3 Claims, 10 Drawing Figures

CONSTRUCTION FOR ELECTRICAL CONTROL PANEL

BACKGROUND OF THE INVENTION

1. Field of the Invention

The present invention relates to an electrical part wherein a sliding member provided on an operating member of a rotary type or slide type is adapted to slide on a circuit pattern formed on an insulating film, and more particularly to a structure for holding the operating member and a structure for protecting the circuit pattern in such an electrical part.

2. Description of the Prior Art

In the electrical parts of the above mentioned type, a rotary variable resistor, for example, of the structure as shown in a cross-sectional view in FIG. 7 has so far been used. Referring to the drawing, 30 denotes an operating member on the operating side of the rotary type variable resistor and 31 denotes a circuit board on its circuit side. On the under surface of the operating member 30 is attached sliding members 32 by fusion and at the circumferential portion thereof is provided a protruded portion 30a. On the circuit board 31 is provided a circuit pattern 33.

The circuit pattern 33, as shown in its plan in FIG. 8, is formed of a resistor layer 34 on the inner side and a current collector layer 35 on the outer side, and the resistor layer 34 and the current collector layer 35 are connected with a desired circuit pattern (not shown) through lead terminals 34a and 35a, respectively. The sliding members 32 are adapted to slide on the resistor layer 34 and the current collector layer 35, while the under surface of the protruded portion 30a is adpated to slide on the circuit board 31 otside the circuit pattern 33, whereby a predetermined clearance is provided between the operating member 30 and the circuit board 31 and the sliding members 32 are thus adapted to slide on the circuit pattern 33 with a constant contact pressure maintained therebetween.

In the rotary type variable resistor structured as above, if the operating member 30 is roatated, the sliding members 32 are accordingly rotated on the circuit pattern 33 and a desired resistance value is thereby obtained through the lead terminals 34a and 35a. At this time, the under surface of the protruded portion 30a formed on the operating member 30 slides on the circuit board 31 outside the circuit pattern 33 as indicated by two-dot chain lines in FIG. 8 and thus crosses portions of the lead terminals 34a, 35a. Accordingly, there have been such disadvantages involved in the prior art electrical part that a great number of repeated rotations of the operating member 30 cause the protruded portion 30a to rub out the lead terminals 34a, 35a thereby leading to disconnection in the circuit pattern 33 and the same cause conductive particles from the leads 34a, 35a to deposit on the under surface of the protruded portion 30a thereby leading to a short circuit in the circuit pattern 33.

On the other hand, a slide type electrical part, in general, is used as a so-called discrete part being provided by incorporating a board on which a circuit pattern of a resistor layer, a current collector layer, and the like are formed and an operating member including a sliding member sliding on the circuit pattern into a frame body forming an external shell.

While a number of various electrical parts having different functions such as push switches and the like including the above slide type electrical parts are disposed according to the need on the front panel of a VTR, microwave oven, and other electronic apparatuses, these parts are usually arranged such that the discrete electrical parts which are partly exposed from the front panel are internally soldered to a printed circuit board at their terminals. Therefore, there has been such an advantage that such a control panel in a constructed state becomes considerably thick.

Therefore, to provide thinner one out of those discrete electrical parts particulary for the push switch, the so-called membrane switch has come to be used, which is formed of a pair of insulating films with upper and lower electrodes printed thereon laminated together with a spacer interposed therebetween. Though the appearance of the membrane switch has contributed to the provision of thinner electrical parts, the above described discrete parts have still been used for the slide type electrical parts, and therefore, the provision of a thinner control panel as a whole has not been sufficiently achieved.

The rotary type electrical part is generally used as a so-called discreter part being provided by incorporating a board, on which a circuit pattern of a resistor layer, current collector layer, and the like are formed, and an operating member including a sliding member sliding on the circuit pattern into a frame body forming an external shell.

While various electrical parts having different functions as push switches, rotary switches, rotary type variable resistors, and the like are provided on the front panel of a VTR, microwave oven, and other electronic apparatuses, these parts are arranged to provide a control panel such that these discrete parts which are partly exposed out of the front panel are internally soldered to a printed circuit board at their terminals. According to the recent tendency in designing toward thinner control panels of the above described type, and particularly for push switches out of the discrete electrical parts, a switch device called a membrane switch has come to be used, which membrane switch is formed of a pair of insulating films with electrodes printed thereon laminated together with a spacer interposed therebetween. As far as the rotary electrical parts are concerned, however, the above described discrete parts have still been used, and therefore, there has been some limit in providing a thinner control panel as a whole.

SUMMARY OF THE INVENTION

It is accordingly a primary object of the present invention to provide an electrical part overcoming the above described disadvantages which the prior art electrical parts have had, being free from possibilities of failures such as disconnection and short circuit in the circuit pattern, and being possible to be made thinner.

BRIEF DESCRIPTION OF THE DRAWINGS

The drawings are all relative to embodiments of the present invention.

DESCRIPTION OF THE PREFERRED EMBODIMENT

A prferred embodiment of the present invention will be described with reference to the accompanying drawings in the following.

Figure 1:
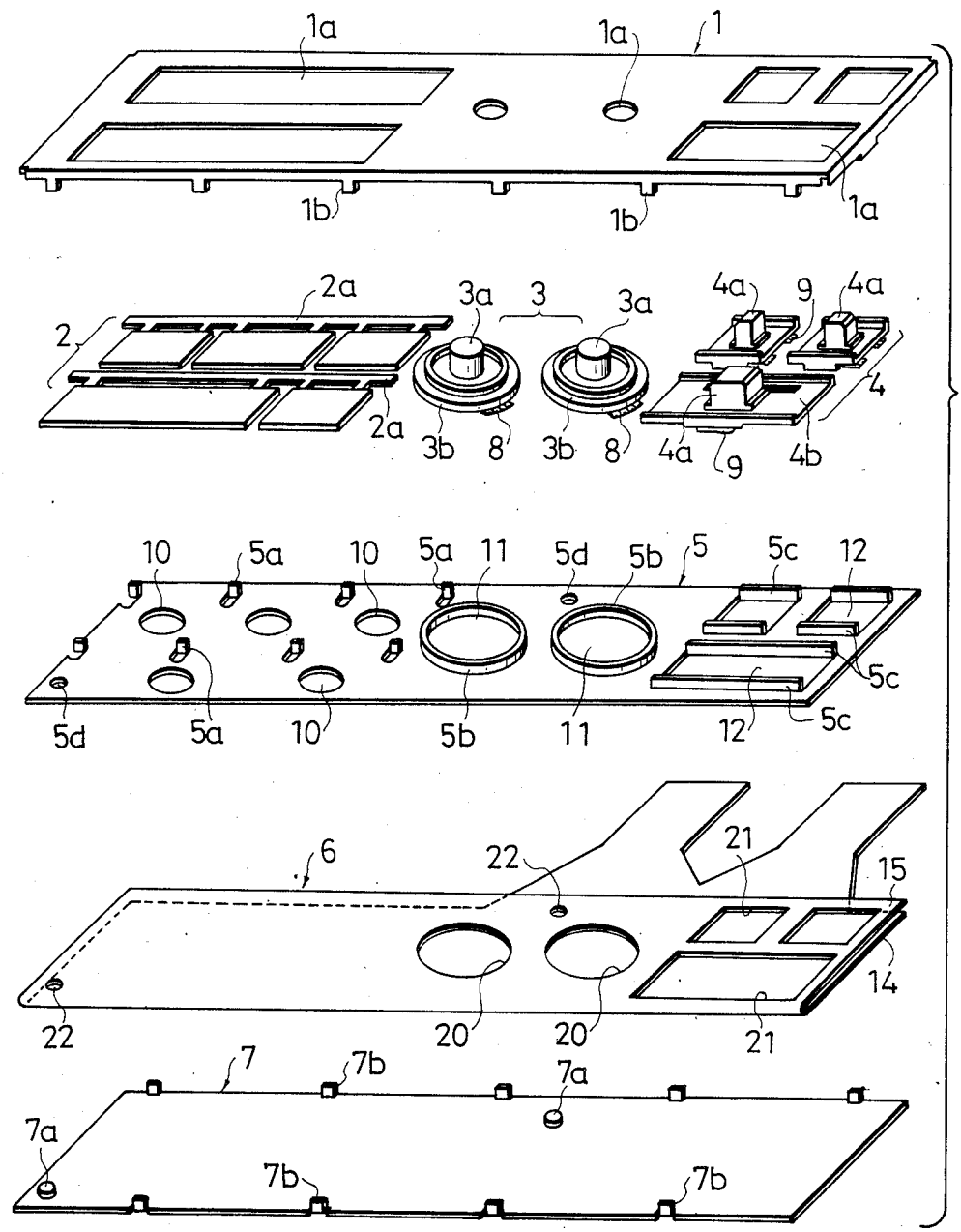
FIG. 1 is an exploded view in perspective showing an overall structure of a control panel.

FIG. 1 is an exploded view in perspective of a control panel relative to an embodiment of the present invention, in which 1 denotes a display panel, 2 denotes an operating member of a push type electrical part, 3 denotes an operating member of a rotary type electrical part, 4 denotes an operating member of a slide type electrical part, 5 denotes an upper support plate, 6 denotes a circuit sheet, and 7 denotes a lower support plate, and the control panel substantially consists of these parts.

The display panel 1 is made of a metallic thin plate of steel or the like and provided with a plurality of through holes 1a punched therein and a plurality of leg portions 1b formed at the circumference thereof.

A plurality of the operating members 2 arranged in a group are each engaged with one of two connecting pieces 2a through hinges and adapted to be projected from the display panel 1 through the trough hole 1a.

The operating member 3 is formed of a knob portion 3a and a receiver portion 3b in a disk shape, and the knob portion 3a is adapted to be projected from the display panel 1 through the through hole 1a. To the under surface of the receiver portion 3b is attached a sliding member 8 by fusion.

Likewise, the operating member 4 is formed of a knob portion 4a and a receiver portion 4b in a rectangular plate form, the knob portion 4a is adapted to be projected out of the display panel 1 through the through hole 1a, and to the under surface of the receiver portion 4b is attached a sliding member 9 by fusion.

The upper support plate 5 is made of a metallic thin plate of steel or the like and provided with means for engaging the operating members 2, 3 and 4. That is, a plurality of circular operating holes 10 are provided by punching in the upper support plate 5 on the left-hand side corresponding to the operating members 2 and a plurality of engagement claws 5a are provided being turned up adjacent to the operating holes 10. The engagement claws 5a are adpated to fix the two connecting pieces 2a to the upper support plate 5 by being turned down, whereby each operating member 2 is held by the upper support plate 5 such that the under surface of the operating member 2 faces on the operating hole 10.

Substantially in the center of the support plate 5 are provided two operating holes 11 of relatively large diameter corresponding to the operating member 3. The operating hole 11 is formed by burring, that is, an annular regulating wall 5b is formed at the circumference of the operating hole 11 at the same time as the operating hole 11 is punched. Two pieces of the operating members 3 are operably supported by the upper support plate 5 for rotation by being fitted at their receiver portions 3b in the regulating walls 5b.

A plurality of rectangular operating holes 12 are provided in the upper support plate on the right-hand side corresponding to the operating members 4. The operating holes 12 are formed by punching and each of the operating holes 12, after being punched, is provided with regulating walls 5c by folding work at one pair of opposing sides. The operating members 4 are operably held by the upper support plate 5 for reciprocating motion by being fitted at their receiver portions 4b in the regulating walls 5c.

The upper support plate 5 is further provided at predetermined positions therein with a plurality of positioning holes 5d of relatively small diameter by punching. Hence, as apparent from the above description, the parts in the upper support plate 5 are all formed by press working.

Figure 2:
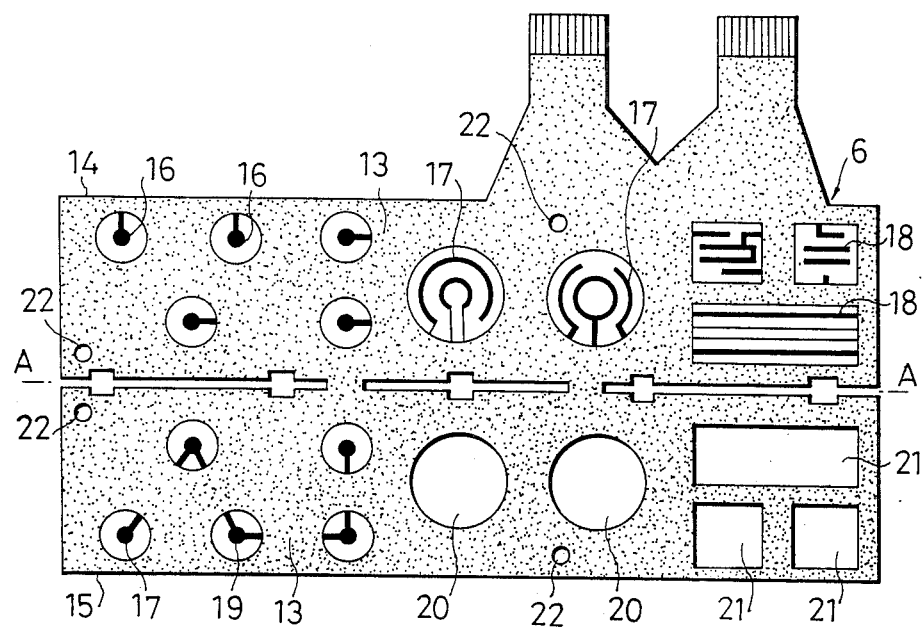
FIG. 2 is a development showing a circuit sheet.

The circuit sheet 6, as shown in the development in FIG. 2, is provided by first forming a desired circuit pattern by printing technique on a base film made of an insulating film of polyester, polyimide, or the like, and then forming an insulating layer 13 serving as the spacer thereover except the portions where contacts for the circuit pattern are provided, and the same is adapted to be folded double along the line A—A in the drawing. The portion of the base film above the line A—A becomes a lower sheet 14 and the protion below the line A—A becomes an upper sheet 15. That is, when the circuit sheet 6 is folded double along the line A—A, the upper sheet 5 is folded up over the lower sheet 14 to form a laminated structure with respective insulating layers 13 sandwiched therebetween.

On the left-hand side on the lower sheet 14, there are provided a plurality of lower electrodes 16 disposed with a predetermined space therebetween as a circuit pattern for push type switches. Substantially in the center, there are provided concentric circular conductive layers 17 as a circuit pattern for rotary type electrical parts such as a roatry type variable resistor, rotary switch, or the like. And on the right-hand side, there are provided linear conductive layers 18 as a circuit pattern for slide type electrical parts such as a slide type switch, slide type variable resistor, or the like. Meanwhile, on the left-hand side on the upper sheet 15, there are provided a plurality of upper electrodes 19 corresponding to the lower electrodes 16. Substantially in the center, there are provided through holes 20 of relatively large diameter by punching corresponding to the conductive layers 17. And on the right-hand side are provided by punching rectangular through holes 21 corresponding to the conductive layers 18. Further, at predetermined positions in the lower sheet 14 and the upper sheet 15 are provided a number of positioning holes 22 of smaller diameter.

Figure 3A:
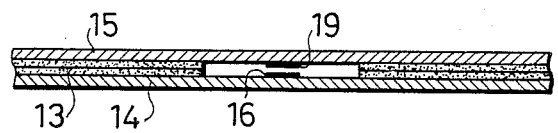
FIGS. 3 (A), (B) and (C) are cross-sectional views showing some parts in the circuit sheet.
Figure 3B:
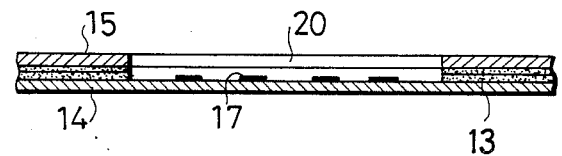
Figure 3C:
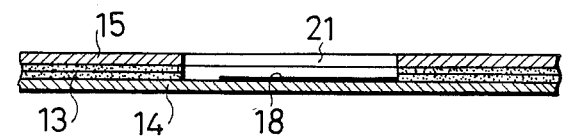

FIGS. 3 are cross-sectional views of the above described circuit sheet 6 in the laminated state showing, respectively, the portions which represent circuit patterns to perform different functions.

FIG. 3 (A) is for explaining the portion of the circuit pattern for the push type switch, in which the lower electrode 16 provided on the lower sheet 14 is disposed opposite to the upper electrode 19 provided on the upper sheet 15 in a separated state with the insulating layers 13 interposed therebetween. When the upper sheet 15 is pressed down, the electrodes 16 and 19 come in contact with each other and produce an ON state, and when the pressing force is removed, the upper sheet 15 returns to its original position by its own elasticity, whereby both the electrodes 16 and 19 are separated to produce an OFF state.

FIG. 3 (B) is for explaining the portion of the circuit pattern for the rotary type electrical part, in which the conductive layer 17 including a resistor layer, current collector layer, or the like provided in the lower sheet 14 is located within the through hole 20 provided in the upper sheet 15, and the sliding member 8 attached to the operating member 3 is adapted to slide on the conductive layer 17.

FIG. 3 (C) is for explaining the portion of the circuit pattern for the slide type electrical part, in which the conductive layer 18 including a resistor layer, current collector layer, or the like provided in the lower sheet 14 are located within the through hole 21 provided in the upper sheet 15, and the sliding member 9 attached to the operating member 4 is adapted to slide on the conductive layer 18.

Returning to FIG. 1, the lower support plate 7 is made of a metallic thin plate of steel or the like, in which a number of positioning protrusions 7a are provided at predetermined positions thereon by burring work, and a number of fixing lugs 7b are provided being turned up at the circumference thereof.

Now, assembly work of the control panel arranged as above will be described in the following.

On the lower support plate 7, the circuit sheet 6 folded double is mounted, and on the same is mounted the upper support sheet 5, and these parts are integrated into one unit by turning down the fixing lugs 7b of the lower support sheet 7 on to the upper support plate 5. At this time, the relative positioning between the upper support plate 5, circuit sheet 6, and the lower support plate 7 can be precisely achieved by fitting the positioning holes 22 and 5d on respective positioning protrusions 7a.

Figure 4:
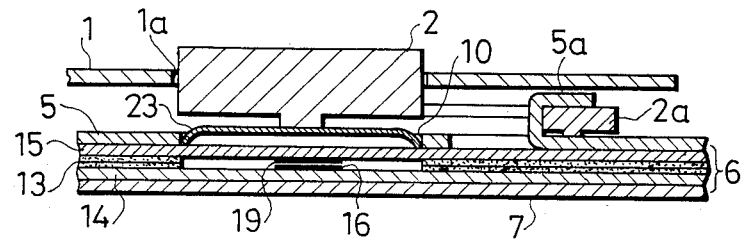
FIG. 4 is a cross-sectional view for explaining operation of a push type switch.
Figure 5:
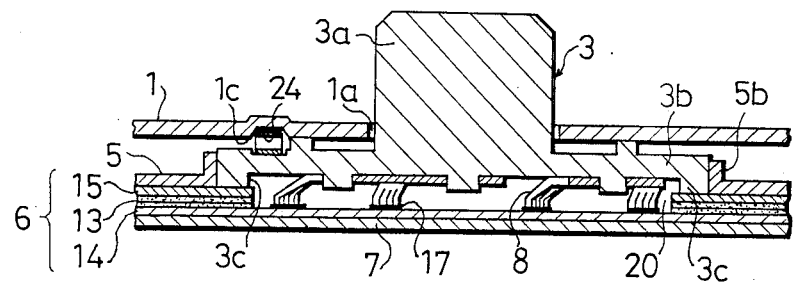
FIG. 5 is a cross-sectional view for explaining operation of a rotary type electrical part.
Figure 6:
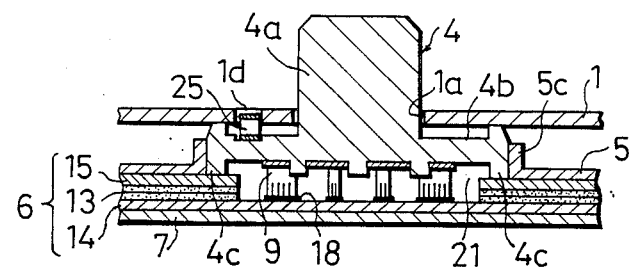
FIG. 6 is a cross-sectional view for explaining operation of a slide type electrical part.
Figure 7:
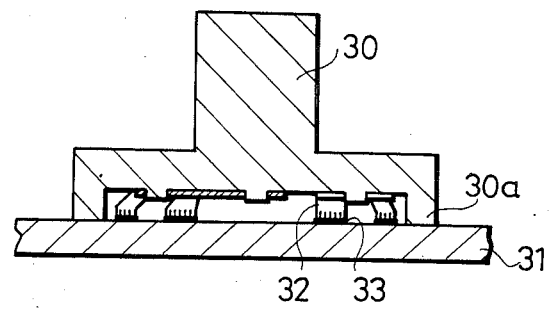
FIG. 7 is a cross-sectional view showing a conventioanl rotary type variable resistor.
Figure 8:
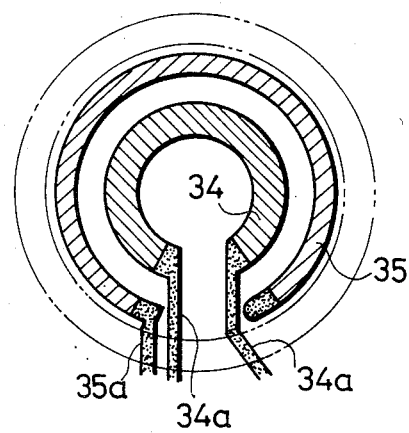
FIG. 8 is a plan view for explaining the circuit pattern of the resistor as shown in FIG. 7.

Then, a cup-shaped tucked spring 23 made of elastic thin plate is put in each operating hole 10 in the upper support plate 5 as shown in FIG. 4, and both the connecting pieces 2a are fixed to the upper support plate 5 by turning down the engagement claws 5a, whereby each of the operating members 2 is held by the upper support plate 5 such that the under surface of the operating member 2 is positioned on the topside of the tacked spring 23. And, the operating member 3 is inserted in the annular regualting wall as shown in FIG. 5, and the operating member 4 is inserted between the opposing regualting walls 5c as shown in FIG. 6. Thus, all the operating members 2, 3 and 4 are engagedly held by the upper sheet 5.

Finally, click springs 24 and 25 are set on the topside of the receiver portion 3b of the operating member 3 and on the topside of the receiver member 4b of the operating member 4, respectively, the display panel 1 is put on the upper support palte 5 such that the operating members 2, 3 and 4 will be partly projected from the corresponding through holes 1a, and then the leg portions 1b of the display panel 1 are turned down on the bottom of the lower support palte 7, whereby all the members are integrated into a unit.

The control panel assembled as described above can be provided in a greatly thinner form than those using conventional discrete parts since it uses a circuit sheet 6 in a film form, namely, an insulating film on which various circuit patterns 16, 17 and 18 are provided by printing technique, on the circuit side of a plurality of electrical parts having different functions.

Operations of the electrical parts as described above will be expalined in the following with reference to FIGS. 4 to 6.

If, in FIG. 4, the operating member 2 on the operating side of the push type switch is pressed down against the elastic force of the tucked spring 23, the tucked spring 23 is reversed at the point where the operating member 2 is lowered by a predetermined stroke by its motion about the connecting piece 2 as the pivot, whereby the upper sheet 15 under the pressure from the tacked spring 23 is deformed to the side toward the lower sheet 14 to cause the upper electrode 19 to come in contact with the lower electrode 16 for turning the switch on. If, then, the pressure applied to the operating member 2 is removed, the operating member 2, the tacked spring 23, and the upper sheet 15 return to their original positions, whereby the upper electrode 19 and the lower electrode 16 are separated to turn the switch off.

If, in FIG. 5, the knob 3a of the operating member 3 on the operating side of the rotary type electrical part is rotated, the sliding member 8 attached by fusion to the bottom of the receiver portion 3b of the operating member 3 rotatively slides on the conductive layer 17 provided on the lower sheet 14, whereby change in the resistance value corresponding to the angle of rotation of the operating member 3 or ON/OFF switch action is provided. At this time, since the circumferential surface of the receiver member 3b of the operating member 3 rotates along the internal surface of the regulating wall 5b on the upper support plate 5, and since the clearance between the operating member 3 and the lower sheet 14 is kept constant by virtue of a protruded portion 3c provided at the circumference of the receiver member 3b, the operating member 3 is enabled to rotate without producing any backlash both in vertical and horizontal directions. Further, since the external diameter of the protruded portion 3c is made larger than the diameter of the through hole 20, there is no possibility for the protruded portion 3c, when the operating member 3 is rotated, to slide on the conductive layer 17 or the lead terminals thereof on the lower sheet 14, that is, the protruded portion 3c always slides on the upper sheet 15 outside the through hole 20, and therefore, such trouble as disconnection or short circuit in the circuit pattern is prevented. Furthermore, since the click spring 24 provided on the topside of the receiver portion 3b of the operating member 3 is adapted, with the rotation of the operating member 3, to be engaged with or disengaged from a click groove 1c formed at a prdetermined position on the display panel 1, the operator when operating the operating member 3 is enabled to perceive the rotational position of the operating member 3 through the sense of clicking of the click spring 24 at the time of the engagement and disengagement.

If, in FIG. 6, the knob 4a of the operating member 4 on the operating side of the slide type electrical part is reciprocated, the sliding member 9 attached by fusion to the under surface of the receiver portion 4b of the operating member 4 slides on the conductive layer 18 provided on the under sheet 14, whereby change in the resistance value corresponding to the slide amount or ON/OFF switch action is provided. At this time, since the outer surfaces of one pair of the opposing sides of the receiver member 4b of the operating memeber 4 move back and force along the inner surface of both the regualting walls 5c on the upper support plate 5, and since the clearance between the operating member 4 and the lower sheet 14 is kept constant by virtue of a protruded portion 4c provided on both sides of the bottom of the receiver portion 4b, the operating member 4 is enabled to slide back and force without producing any backlash both in vertical and horizontal directions. Further, since the distance from the external face of the protruded portion 4c to that of the other protruded portion 4c is made larger than the width of the through hole 21, the protruded portions 4c, when the operating member 4 is operated to slide, always slide on the upper sheet 15 outside the through hole 21, and therefore, such trouble as disconnection and short circuit in the circuit pattern is prevented from occurring in the slide type electrical part like in the rotary type electrical part as described above. Furthermore, since the click spring 25 provided on the topside of the receiver portion 4b of the operating member 4 is adapted, with the reciprocatory movements of the operating member 4, to be engaged with or disengaged from a click hole 1d, which is formed at a predetermined position on the display panel, the operator is enabled to perceive the sliding position of the operating member 4 through the sense of clicking of the click spring 25 at the time of the engagement and disengagement.

While, in the above description of the embodiment, the circuit sheet 6 was of a three-layer structure of the upper sheet 15, insulating layer 13, and the lower sheet 14, an insulating film can be used as a spacer instead of the insulating layer 13. And, the portion excepting the circuit pattern for the push type switches may be made into a two-layer structure of the upper sheet 15 and the lower sheet 14.

Further, although the circuit patterns 17 and 18 were formed on the lower sheet 14 in the above description of the embodiment, the circuit patterns 17 and 18 may be formed on the spacer when an insulating film is used as the spacer with the through holes 20 and 21 in the upper sheet 15 located over the circuit patterns 17 and 18.

According to the present invention, as so far described, a circuit sheet in a film form is used on the circuit side of a rotary type electrical part and slide type electrical part, and therefore designing of thinner parts has been made possible. And, since an operating member on the operating side of the electrical part is adapted to slide on a second insulating film which is folded back on a first insulating film on which circuit patterns are formed, such trouble as disconnection and short circuit in the circuit pattern has become preventable.

Further, according to the present invention, not only a circuit sheet in a film form can be used on the circuit side of the rotary type electrical part, but also an annular regualating wall being provided by burring work in a support plate which sandwiches the circuit sheet between the same and another support plate is enabled to engagedly and rotatably hold the operating member on the operating side of the electrical part. Likewise, according to the present invention, not only a circuit sheet in a film form can be used on the circuit side of a slide type electrical part, but also a turned-up regualting walls provided by bending work on the support plate for sandwiching the circuit sheet between the same and the other support plate are enabled to engagedly and rotatably hold the operating member on the operating side of the electrical part. By such arrangements, these electrical parts can be made much thinner in comparison with those of conventional discrete slide type fixed to the printed circuit board by soldering.

What is claimed is:

1. A construction for an electrical control panel comprising a circuit pattern on one side of an insulating sheet, a sliding member slidable on said circuit pattern of said insulating sheet, a rotary operating member for operating said sliding member, said sheet being sandwiched between a pair of support plates with one of said support plates disposed on said circuit pattern side of said insulating sheet, and means for slidably and engagedly holding said rotary operating member in position for operating said sliding member, including an operating hole formed through said one support plate and an upturned annular holding wall surrounding said operating hole and having an inner annular surface for holding said operating member rotatably and engagedly with said operating member projecting from said operating hole provided in said one support plate.

2. A construction for an electrical control panel comprising a circuit pattern on one side of a first insulating sheet part, a second insulating sheet part provided with a through hole and being folded back on said one side of said first insulating sheet part to form a laminated structure, a sliding member slidable on said circuit pattern of said first insulating sheet part in said through hole of said second insulating sheet part, an operating member for operating said sliding member, said laminated structure being sandwiched between a pair of support plates with one of said support plates disposed on said circuit pattern side of said laminated structure, and means for slidably and engagedly holding said operating member in position for operating said sliding member, including an operating hole formed through said one support plate coincident with said through hole of said second insulating sheet part, wherein said operating member is projected from said operating hole in said one support plate and has a lower surface adapted to slide on said second insulating sheet part around said through hole.

3. An electrical part according to claim 2, wherein said operating member is a linear slide type operating member and said means for slidably and engagedly holding said linear slide operating member is constituted of an operating hole provided in said one support plate and regulating walls provided by bending work at the edges of a pair of opposing sides of said through hole for slidably guiding said linear slide operating member.

* * * * *